United States Patent [19]

Imai et al.

[11] Patent Number: 5,650,259
[45] Date of Patent: Jul. 22, 1997

[54] PROCESSES FOR PATTERN FORMATION USING PHOTOSENSITIVE COMPOSITIONS AND LIQUID DEVELOPMENT

[75] Inventors: Genji Imai; Naozumi Iwasawa, both of Hiratsuka; Tsuguo Yamaoka, Funabashi, all of Japan

[73] Assignee: Kansai Paint Co., Ltd., Hyogo, Japan

[21] Appl. No.: 553,978

[22] Filed: Nov. 6, 1995

Related U.S. Application Data

[62] Division of Ser. No. 227,346, Apr. 14, 1994, Pat. No. 5,496,678.

[30] Foreign Application Priority Data

Apr. 16, 1993 [JP] Japan ................... 5-113769
Apr. 23, 1993 [JP] Japan ................... 5-119353

[51] Int. Cl.$^6$ ............... G03F 7/30; G03F 7/38; G03F 7/40
[52] U.S. Cl. ............... 430/258; 430/325; 430/326; 430/327; 430/330
[58] Field of Search ............... 430/176, 281.1, 430/286.1, 287.1, 325, 326, 330, 258, 259, 327; 522/31, 32, 65, 158

[56] References Cited

U.S. PATENT DOCUMENTS

| | | | |
|---|---|---|---|
| 3,779,778 | 12/1973 | Smith et al. | 430/176 |
| 4,491,628 | 1/1985 | Ito et al. | 430/176 |
| 5,364,738 | 11/1994 | Kondo et al. | 430/283 |
| 5,366,846 | 11/1994 | Knudson et al. | 430/280 |
| 5,496,678 | 3/1996 | Imai et al. | 430/176 |

FOREIGN PATENT DOCUMENTS 0 284 868  10/1988  European Pat. Off. .

*Primary Examiner*—Christopher G. Young
*Attorney, Agent, or Firm*—Wenderoth, Lind & Ponack

[57] ABSTRACT

A photosensitive composition which comprises, as essential components:

(A) a polymer having carboxyl group(s) and hydroxyphenyl group(s), or (A') a polymer having carboxy group(s) and (A") a polymer having hydroxyphenyl group(s), (B) a compound having at least two vinyl ether groups in the molecule, and (C) a compound which generates an acid when irradiated with am actinic ray, and which is useful as a positive type photoresist having high resolution and excellent formability of fine image pattern, a material for printing, etc.; and a process for pattern formation using said composition.

3 Claims, No Drawings

PROCESSES FOR PATTERN FORMATION USING PHOTOSENSITIVE COMPOSITIONS AND LIQUID DEVELOPMENT

This application is a division of application Ser. No. 08/227,346, filed Apr. 14, 1994 (now U.S. Pat No. 5,496,678).

The present invention relates to photosensitive compositions, as well as to processes for pattern formation using said compositions, which are useful in formation of circuit patterns of electronic devices, materials for printing, etc.

Currently, positive type photoresists are in wide use for formation of circuit patterns of electronic devices, etc. Many of the positive type resist compositions used in these applications are each a combination of an alkali-soluble novolac resin and a quinone diazide compound acting as a photosensitizer.

This composition utilizes a reaction in which the quinone diazide is photo-decomposed when irradiated with an ultraviolet light and forms an indenecarboxylic acid via ketone.

The resist using a quinone diazide, however, is insufficient in resolution in some cases when a very fine pattern must be formed. A CEL (contrast enhanced layer) technique is used in order to increase the resolution. The use of CEL, however, invites lower photosensitivity, longer exposure time and reduced work efficiency.

Further in the resist using a quinone diazide compound, the development must be made under strictly controlled conditions because the development is conducted by utilizing the difference in solubility between exposed portions and unexposed portions. In order to obtain good reproducibility in the development, it is necessary to employ strictly controlled development conditions. However, since the unexposed portions of the resist film are not completely insoluble in the developer used, the unexposed portions are partly dissolved or cause swelling during the development step, whereby the pattern formed has lower resistance to the etchant used and tends to have lower precision.

Meanwhile in U.S. Pat. No. 3,779,778, U.S. Pat. No. 4,491,628, EP-A-284,868, etc. are proposed compositions for pattern formation and processes for pattern formation using said compositions. With these compositions, pattern formation is conducted as follows. That is, the latent image (pattern) portions of the film formed with said composition are irradiated with an ultraviolet light, an electron beam or the like to generate an acid; the acid acts as a catalyst to allow the polymer in said portions to give rise to an elimination reaction in the form of a chain reaction; thereby, the exposed portions and the unexposed portions have different solubilities in a developer to be used, making pattern formation possible.

These compositions are higher in light quantum yield than the compositions using a quinone diazide as a photosensitizer and consequently have higher photosensitivity. However, they have the same problems associated with development, as mentioned above for the compounds using a quinone diazide, because they employ the same development mechanism as the latter compositions.

The objects of the present invention are to provide a photosensitive composition which is free from the above-mentioned drawbacks of the conventional positive type photosensitive compositions, which functions in a novel mechanism, and which is useful particularly as a positive type photoresist, a material for printing, etc., as well as a process for pattern formation using said composition.

The present inventors made a study on the elimination of the above-mentioned drawbacks of conventional positive type photosensitive compositions. As a result, the present inventors have discovered that a composition comprising a polymer having carboxyl group(s) and phenolic hydroxyl group(s), a compound having a plurality of vinyl ether groups and a compound which is decomposed and generates an acid when irradiated with an actinic ray, and a composition comprising a polymer having carboxyl group(s), a polymer having hydroxyphenyl group(s), a compound having a plurality of vinyl ether groups and a compound which is decomposed and generates an acid when irradiated with an actinic ray, each provide a photosensitive composition which functions in the following novel mechanism. That is, the coating film formed with each of said compositions, when heated, gives rise to an addition reaction between (a) the carboxyl group(s) and/or the hydroxyphenyl group(s) and (b) the vinyl ether groups and generates a crosslinked structure which is insoluble in solvents and aqueous alkaline solutions; this crosslinked structure, when irradiated with an actinic ray and then heated, is severed by the catalytic action of the acid generated by the irradiation and, as a result, the exposed portions of the coating film becomes again soluble in solvents and aqueous alkaline solutions. The finding has led to the completion of the present invention.

According to the first aspect of the present invention, there is provided a photosensitive composition comprising, as essential components:

(A) a polymer having carboxyl group(s) and hydroxyphenyl group(s), (B) a compound having at least two vinyl ether groups in the molecule, and (C) a compound which generates an acid when irradiated with an actinic ray, as well as a process for pattern formation using said composition.

According to the second aspect of the present invention, there is provided a photosensitive composition comprising, as essential components:

(A') a polymer having carboxyl group(s), (A") a polymer having hydroxyphenyl group(s), (B) a compound having at least two vinyl ether groups in the molecule, and (C) a compound which generates an acid when irradiated with an actinic ray, as well as a process for pattern formation using said composition.

The compositions of the present invention are free from the above-mentioned problems seen in conventional positive type resists, because the unexposed portions of the coating film formed therewith have a crosslinked structure completely insoluble in solvents or aqueous alkaline solutions as a developer and, during the development, cause neither dissolution nor swelling.

Further, the compositions of the present invention can have high transparency to actinic rays because they need not contain a large amount of a functional group of high extinction coefficient unlike resists using quinone diazide as a photosensitizer. Also, the components of the present invention can have high sensitivity as a positive type photosensitive composition because they generate an acid when irradiated with an actinic ray and the acid, when heated, acts as a catalyst to sever the formed crosslinked structure in the form of a chain reaction.

Furthermore, the present compositions can form a pattern of very high contrast and, consequently, are very useful as a resist for formation of fine pattern.

The present invention is hereinafter described in more detail.

(A) Polymer having carboxyl group(s) and hydroxyphenyl group(s)

The polymer (A) used in the photosensitive composition according to the first aspect of the present invention is a film-formable polymer having at least one carboxyl group and at least one hydroxyphenyl group in the molecule. The polymer (A) includes, for example, a copolymer of a hydroxystyrene (e.g. p-hydroxystyrene) and a carboxyl group-containing polymerizable unsaturated monomer; and a copolymer of said hydroxystyrene, said carboxyl group-containing monomer and other copolymerizable monomer.

The carboxyl group-containing polymerizable unsaturated monomer includes, for example, acrylic acid, methacrylic acid, crotonic acid and itaconic acid. The other copolymerizable monomer includes, for example, $C_1$–$C_{12}$ alkyl esters of (meth)acrylic acid, such as methyl (meth) acrylate, ethyl (meth)acrylate, propyl (meth)acrylate, butyl (meth)acrylate, hexyl (meth)acrylate, octyl (meth)acrylate, 2-ethylhexyl (meth)acrylate, nonyl (meth)acrylate, decyl (meth)acrylate and the like; $C_2$–$C_6$ hydroxyalkyl esters of (meth)acrylic acid, such as hydroxyethyl (meth)acrylate, 2-hydroxypropyl (meth)acrylate, 3-hydroxypropyl (meth) acrylate, hydroxybutyl (meth)acrylate and the like; vinyl aromatic compounds such as styrene, α-methylstyrene, p-tert-butylstyrene and the like; vinyl acetate; (meth) acrylonitrile; (meth)acrylamide; and vinylpyrrolidone. These monomers can be used singly or in combination of two or more.

As the polymer (A), there may be also used a polymer obtained by condensing formaldehyde with a phenolcarboxylic acid (e.g. hydroxyben-zoic acid, gallic acid or resorcinolcarboxylic acid) or a mixture of said phenolcarboxylic acid and at least one phenol compound selected from phenol, $C_1$–$C_{18}$ mono- or dialkyl phenols or naphthols, resorcin, catechol, etc.

The polymer (A) preferably has a number-average molecular weight of generally about 500 to about 100,000, particularly about 1,500 to about 30,000. In the polymer (A), the desirable carboxyl group content is generally 0.5–10 equivalents, particularly 0.5–5 equivalents per kg of the polymer (A), and the desirable hydroxyphenyl group content is at least 1 equivalent, particularly 2–8 equivalents per kg of the polymer (A). When the carboxyl group content is less than 0.5 equivalent/kg, the film formed by heating before irradiation with an actinic ray has no sufficient crosslinking degree and the exposed portions tend to have low solubility in alkaline developer, resulting in low developability. When the carboxyl group content is more than 10 equivalents/kg, the resulting composition tends to have low storage stability. When the hydroxyphenyl group content is less than 1 equivalent/kg, no sufficient crosslinking may be obtained.

Further, the polymer (A) preferably has a glass transition temperature (Tg) of not lower than 0° C. particularly 5°–70° C. When the glass transition temperature is lower than 0° C., the resulting coating film is sticky and easily picks up dirt and dust, often making the handling difficult.

(A') Polymer having carboxyl group(s)

The polymer (A') used in the photosensitive composition according to the second aspect of the present invention is a film-formable polymer having at least one carboxyl group in the molecule. Examples of the polymer (A') are a homopolymer of a carboxyl group-containing polymerizable unsaturated monomer; a copolymer of said carboxyl group-containing monomer and other copolymerizable monomer; and a resin of polyester type, polyurethane type, polyamide type or other type having carboxyl group(s) in the molecular chain or at the molecular end(s).

The carboxyl group-containing polymerizable unsaturated monomer includes, for example, acrylic acid, methacrylic acid, crotonic acid and itaconic acid. The other monomer copolymerizable with the carboxyl group-containing monomer includes, for example, $C_1$–$C_{12}$ alkyl esters of (meth)acrylic acid, such as methyl (meth)acrylate, ethyl (meth)acrylate, propyl (meth)acrylate, butyl (meth) acrylate, hexyl (meth)acrylate, octyl (meth)acrylate, 2-ethylhexyl (meth)acrylate, nonyl (meth)acrylate, decyl (meth)acrylate and the like; $C_2$–$C_6$ hydroxyalkyl esters of (meth)acrylic acid, such as hydroxyethyl (meth)acrylate, 2-hydroxypropyl (meth)acrylate, 3-hydroxypropyl (meth) acrylate, hydroxybutyl (meth)acrylate and the like; vinyl aromatic compounds such as styrene, α-methylstyrene, p-tert-butylstyrene and the like; vinyl acetate; (meth) acrylonitrile; (meth)acrylamide; and vinylpyrrolidone. These monomers can be used singly or in combination of two or more. Among said other monomers, preferable are vinyl aromatic compounds such as styrene, α-methylstyrene, $C_1$–$C_6$ alkyl-substituted styrenes (e.g. p-tert-butylstyrene) and the like, in view of the precision of image pattern formed, etching resistance, etc.

The carboxyl group-containing polymer (A') preferably has a number-average molecular weight of generally about 3,000 to about 100,000, particularly about 5,000 to about 30,000. In the polymer (A'), the desirable carboxyl group content is generally 0.5–10 equivalents, particularly 0.5–5 equivalents per kg of the polymer (A'). When the carboxyl group content is less than 0.5 equivalent/kg, the film formed by heating before irradiation with an actinic ray has no sufficient cross-linking degree and the exposed portions tend to have low solubility in alkaline developer, resulting in low developability. When the carboxyl group content is more than 10 equivalents/kg, the resulting composition tends to have low storage stability.

Further, the polymer (A') preferably has a glass transition temperature (Tg) of not lower than 0° C., particularly 5°–70° C. When the Tg is lower than 0° C., the resulting coating film is sticky and easily picks up dirt and dust, often making the handling difficult.

(A") Polymer having hydroxylphenyl group(s)

The polymer (A") used in the photosensitive composition according to the second aspect of the present invention is a polymer having at least one hydroxyphenyl group in the molecule. Examples of the polymer (A") are a condensation product of (a) a monofunctional or polyfunctional phenol compound, an alkylphenol compound of their mixture and (b) a carbonyl compound such as formaldehyde, acetone or the like; a homopolymer of a hydroxyl group-containing vinyl aromatic compound such as p-hydroxystyrene or the like; and a copolymer of said hydroxyl group-containing vinyl aromatic compound and other copolymerizable monomer.

The monofunctional or polyfunctional phenol compound includes compounds each having 1–3 hydroxyl groups on the benzene ring, such as phenol, o-cresol, m-cresol, p-cresol, 3,5-xylenol, 2,6-xylenol, 2,4-xylenol, catechol, resorcin, pyrogallol, bisphenol A and the like. The alkylphenol compound includes alkylphenol compounds whose alkyl moieties each has 1–10 carbon atoms, preferably 1–4 carbon atoms, such as p-isopropylphenol, p-tert-butylphenol, p-tert-amylphenol, p-tert-octylphenol and the like.

The condensation reaction between these compounds and the carbonyl compound such as formaldehyde, acetone or the like can be conducted by a per se known method. In general, condensation using an alkali catalyst gives a resole type product which becomes insoluble and infusible with the progress of condensation; and condensation using an acid catalyst gives a novolac type product which is soluble and fusible. In the present invention, the latter novolac type phenolic resin can be used ordinarily. While novolac type phenolic resins increase the molecular weight with the progress of condensation, a novolac type phenolic resin having a molecular weight of 500-2,000, obtained by conducting condensation for 1-3 hours is suitable generally.

As the other monomer copolymerizable with the hydroxyl group-containing vinyl aromatic compound, there can be used the same other copolymerizable monomers as mentioned with respect to the copolymer used as the polymer (A').

The hydroxyphenyl group-containing polymer (A") preferably has a number-average molecular weight of generally about 500 to about 100,000, particularly about 1,000 to about 30,000.

In the polymer (A"), the preferably hydroxyphenyl group content is generally 1-10 equivalents, particularly 2-8 equivalents per kg of the polymer (A"). When the hydroxylphenyl group content is less than 1 equivalent/kg, the film formed by heating before irradiation with an actinic ray tends to have insufficient crosslinking degree and, when the content is more than 10 equivalents/kg, the resist film tends to be fragile.

The polymer (A"), similarly to the polymer (A'), preferably has a glass transition temperature (Tg) of not lower than 0° C., particularly 5°–70° C. When the Tg is lower than °C., the resulting coating film is sticky and easily picks up dirt and dust, often making the handling difficult.

(B) Compound having at least two vinyl ether groups in the molecule

The compound (B) is a low-molecular weight or high-molecular weight compound having, in the molecule, at least two, preferably two to four vinyl ether groups each represented by general formula —R—O—CH=CH$_2$ wherein R represents a C$_1$–C$_6$ straight-chain or branched chain alkylene group such as ethylene, propylene, butylene or the like. Examples of the compound (B) are condensation products between (1) a polyphenol compound (e.g. bisphenol A, bisphenol F, bisphenol S or a phenolic resin) or a polyol (e.g. ethylene glycol, propylene glycol, trimethylolpropane, trimethylolethane, or pentaerythritol) and (2) a halogenated alkyl vinyl ether (e.g. chloroethyl-vinyl ether), and reaction products between a polyisocyanate (e.g. tolylene diisocyanate, xylylene diisocyanate, hexamethylene diisocyanate or isophorone diisocyanate) and a hydroxyalkyl vinyl ether (e.g. hydroxyethyl vinyl ether). Among these, condensation products between a polyphenol compound and a halogenated alkyl vinyl ether, and reaction products between a polyisocyanate compound having an aromatic ring and a hydroxyalkyl vinyl ether are particularly preferable in view of etching resistance, precision of pattern formed, etc.

Preferably, the compound (B) is a liquid at normal temperature, or has a melting or softening point of not higher than 150° C., particularly not higher than 130° C. The reason is that such a compound (B) can easily migrate into the polymer (A) or into the polymer (A') and/or the polymer (A") at the heating step before irradiation with an actinic ray and the carboxyl group(s) and/or the phenolic hydroxyl group(s) in said polymers can easily give rise to an addition reaction with the vinyl ether groups in the compound (B).

(C) Compound which generates an acid when irradiated with an actinic ray

The compound (C) is a compound which, when irradiated with an actinic ray (described later), is decomposed and generates an acid having a strength sufficient to sever the crosslinked structure formed between the polymer (B) and the polymer (A) or the polymer (A') and/or the polymer (A"). [Hereinafter, the compound (C) is referred to as "photochemically-acid-generating compound" in some cases.] The compound (C) includes, for example, the compounds represented by the following formulae (I) to (XIV).

wherein Ar represents an aryl group such as phenyl or the like; and $X^\ominus$ represents $PF_6{}^\ominus$, $SbF_6{}^\ominus$ or $AsF_6{}^\ominus$.

wherein Ar and $X^\ominus$ have the same definitions as above,

wherein R represents an alkyl group of 1–12 carbon atoms or an alkoxy group of 1–12 carbon atoms; n represents 0–3; and $X^\ominus$ has the same definition as above,

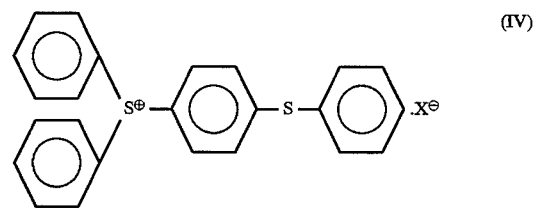

wherein $X^\ominus$ has the same definition as above,

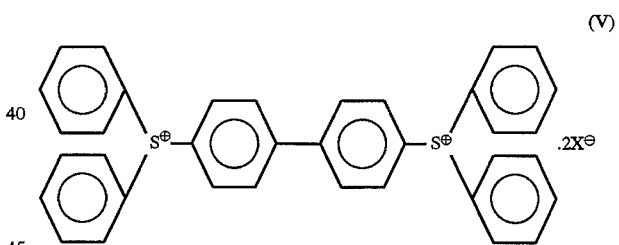

wherein $X^\ominus$ has the same definition as above,

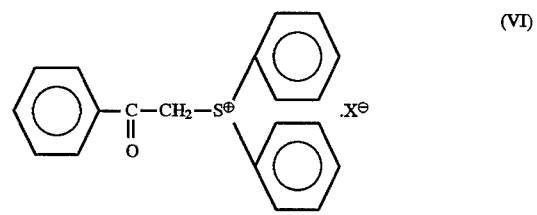

wherein $X^\ominus$ has the same definition as above,

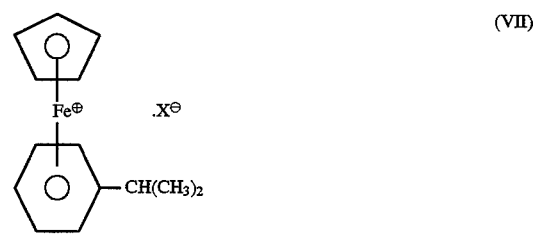

wherein X$^\ominus$ has the same definition as above,

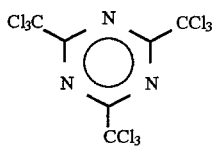 (VIII)

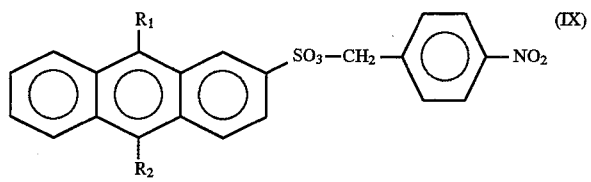 (IX)

wherein $R_1$ and $R_2$ independently represent an alkyl group of 1–5 carbon atoms or an alkoxy group of 1–12 carbon atoms,

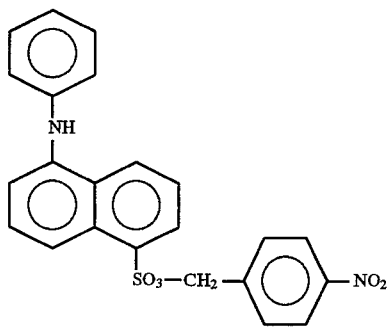 (X)

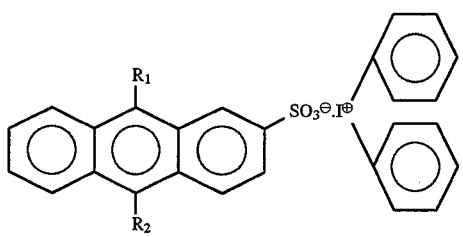 (XI)

wherein $R_1$ and $R_2$ have the same definitions as above,

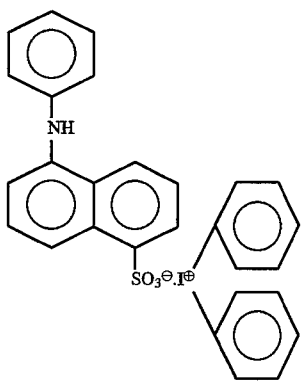 (XII)

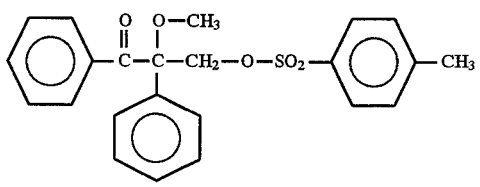 (XIII)

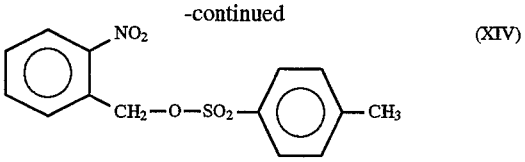 (XIV)

Photosensitive composition

The photosensitive composition according to the first aspect of the present invention comprises, as essential components, the above-mentioned three components, i.e. the polymer (A) having carboxyl group(s) and hydroxyphenyl group(s), the compound (B) having vinyl ether groups and the photochemically-acid-generating compound (C). The compounding ratio of the three components in the composition can be varied over a wide range depending upon the applications of the composition, etc. However, the compound (B) having vinyl ether groups is preferably used in an amount of generally 5–150 parts by weight, particularly 10–100 parts by weight per 100 parts by weight of the polymer (A). The photochemically-acid-generating compound (C) is appropriately used in an amount of generally 0.1–40 parts by weight, particularly 0.2–20 parts by weight per 100 parts by weight of the total of the polymer (A) and the compound (B) having vinyl ether groups.

The photosensitive composition according to the second aspect of the present invention comprises, as essential components, the above-mentioned four components, i.e. the carboxyl group-containing polymer (A'), the hydroxyphenyl group-containing polymer (A"), the compound (B) having vinyl ether groups and the photochemically-acid-generating compound (C). The compounding ratio of the four components in the composition can be varied over a wide range depending upon the applications of the composition, etc. However, the carboxyl group-containing polymer (A') and the hydroxyphenyl group-containing polymer (A") can be used in the range of generally 90/10 to 10/90, particularly 70/30 to 30/70 in terms of the weight ratio of (A')/(A"). The compound (B) having vinyl ether groups is preferably used in an amount of generally 5–150 parts by weight, particularly 10–100 parts by weight per 100 parts by weight of the total of the carboxyl group-containing polymer (A') and the hydroxyphenyl group-containing polymer (A"). The photochemically-acid-generating compound (C) is appropriately used in an amount of generally 0.1–40 parts by weight, particularly 0.2–20 parts by weight per 100 parts by weight of the total of the carboxyl group-containing polymer (A'), the hydroxyphenyl group-containing polymer (A") and the compound (B) having vinyl ether groups.

The photosensitive compositions of the present invention may further comprise a sensitizing colorant, as necessary. The sensitizing colorant usable includes colorants of phenothiazine type, anthracene type, coronene type, benzanthracene type, perylene type, pyrene type, merocyanine type, ketocoumarin type and other types.

The appropriate amount of the sensitizing colorant used is 0.1–10 parts by weight, preferably 0.3–5 parts by weight per 100 parts by weight of the polymer (A) or 100 parts by weight of the total of the polymer (A') and the polymer (A").

The photosensitive compositions of the present invention may also comprise a plasticizer (e.g. phthalic acid ester), a polyester resin, an acrylic resin, etc. in order to allow the resulting film to have appropriate flexibility, non-tackiness, etc. The preferable amount of these additives is generally 50 parts by weight or less per 100 parts by weight of the total of the polymer (A), the compound (B) having vinyl ether groups and the photochemically-acid-generating compound (C), or 100 parts by weight of the total of the polymer (A'), the polymer (A"), the compound (B) having vinyl ether groups and the photochemically-acid-generating compound (C).

The photosensitive compositions of the present invention may furthermore comprise a fluidity-controlling agent, a colorant (e.g. dye or pigment), etc. as necessary.

The photosensitive compositions of the present invention can be prepared by mixing the above-mentioned components alone or, as necessary, in a solvent. The solvent has no particular restriction as lone as it can dissolve the components. The solvent can be exemplified by ketones such as acetone, methyl ethyl ketone, methyl isobutyl ketone, cyclohexanone, isophorone and the like; esters such as methyl acetate, ethyl acetate, butyl acetate and the like; $C_1$–$C_{10}$ aliphatic alcohols such as methanol, ethanol, propanol and the like; aromatic group-containing alcohols such as benzyl alcohol and the like; glycols such as ethylene glycol, propylene glycol and the like; glycol ethers such as mono- or diether between said glycol and an alcohol (e.g. methanol, ethanol, butanol, hexanol, octanol, benzyl alcohol or phenol), ester of said monoether and the like; cyclic ethers such as dioxane, tetrahydrofuran and the like; cyclic carbonates such as ethylene carbonate, propylene carbonate and the like; and aliphatic or aromatic hydrocarbons. These solvents can be used singly or in admixture of two or more so as to best meet the purpose.

Formation of pattern

Pattern formation using the photosensitive compositions of the present invention can be conducted as follows. First, the composition of the present invention is coated on a substrate such as presensitized aluminum plate for offset printing, copper-laminated substrate for printed circuit, silicon wafer as a semiconductor material, or the like by a per se known coating method such as spin coating, spray coating, roll coating, curtain flow coating, printing or the like. The thickness of the resulting coating film is not strictly restricted and can be varied depending upon the intended application of the pattern formed, etc. However, the appropriate thickness is ordinarily about 0.5–15 µm in terms of dry-film thickness.

The composition-coated substrate is heated under the conditions of temperature and time under which a crosslinking reaction takes place substantially between (1) the polymer (A), or the polymer (A') and/or the polymer (A") and (2) the compound (B) having vinyl ether groups, for example, at about 60°–150° C. for about 1–30 minutes to allow the coating film on the substrate to crosslink and cure.

Then, the cured coating film on the substrate is irradiated image-selectively with an actinic ray, using a positive type photomask, a reduction projection aligner, a direct-drawing machine or the like. The actinic ray is selected depending upon, for example, the kind of the photochemically-acid-generating compound (C) used in the photosensitive composition and includes, for example, an electron beam, a monochromatic light having a wavelength of 200–600 nm and a mixed light thereof.

The substrate irradiated with an actinic ray is then heated under the conditions of temperature and time under which the crosslinked structure of said cured coating film is cleaved off in the presence of the acid generated by the above irradiation with an actinic ray, for example, at about 60°–150° C. for about 1–30 minutes, whereby the crosslinked structure of the exposed portions of the cured coating film is cleaved off substantially.

The thus treated substrate after heating irradiation-heating is treated with a developer, whereby a pattern can be formed on the substrate. As the developer, there can be used a liquid capable of dissolving the polymer (A) or the polymer (A'), for example, an aqueous solution of a water-soluble organic base [e.g. alkanolamine hydroxyammonium salt (e.g. tetraethylammonium hydroxide)] or an inorganic alkali (e.g. sodium hydroxide, sodium carbonate or sodium metasilicate).

These basic substances can be used singly or as a mixture of two or more. The preferable concentration of these substances is ordinarily 0.05–10% by weight. It is possible to add as necessary, to the developer, the solvent mentioned with respect to the production of the photosensitive composition of the present invention, in a concentration in which the solvent is miscible with the developer.

The development can be conducted by a per se known method, for example, by dipping the substrate after heating irradiation-heating, in the developer, or by spraying the developer onto the substrate. The substrate, on which a pattern has been formed, can be as necessary water-washed and/or heated for drying.

When the substrate is an etchable type, it is possible to remove the exposed portions of the substrate with an appropriate etchant and, if further necessary, remove the remaining coating film with an appropriate releasant to obtain a relief image.

The photosensitive compositions of the present, invention can also be used as a dry film type resist.

In an example, the photosensitive composition obtained as mentioned previously is coated on a transparent rent and flexible supporting film (e.g. polyethylene terephthalate film) capable of transmitting an actinic ray; the composition-coated film is as necessary subjected to a heating treatment to remove the solvent, etc. present in the composition; thereby, a dry film resist is prepared. As necessary, a protective layer may be formed on the resist side of said film by mounting a releasable film on said side. Alternatively, it is possible that a resist film be formed on a releasable film by the above-mentioned method and then a supporting film be mounted on the resist film. The appropriate thickness of the supporting film and the releasable film are each about 10–250 µm generally, in view of the handleability of the resist, etc.

Desirably, the adhesivity between the releasable film and the resist film is generally about $\frac{1}{10}$ or less of the adhesivity between the supporting film and the resist film. When the adhesivity between the releasable film and the resist film is large, the operation of peeling off the releasable film from the dry film is difficult.

Also desirably, the adhesivity between the resist film and the supporting film when the dry film has been laminated onto a substrate by a method described later and then has been heated for crosslinking and irradiated, is about $\frac{1}{3}$ or less of the adhesivity between the resist film and the substrate because the supporting film must be removed before development. In order to achieve this, the surface of the supporting film may be subjected beforehand to an ordinary treatment for easy peeling and the surface of the substrate may be subjected beforehand to a treatment such as physical polishing, chemical soft etching or the like.

The photochemical compositions of the present invention can also be used as a transfer film type resist, as follows.

A transfer film type resist can be prepared in the same manner as in the dry film type resist. However, the preparation of the transfer film type resist is different from the preparation of the dry film type resist in that the adhesivity between the supporting film and the resist film is desirably about $\frac{1}{3}$ or less of the adhesivity between the substrate and the resist film when the transfer film type resist has been laminated onto the substrate or when the laminated resist type film has been heated for crosslinking and that the supporting film can be not only a light-transmittable film but also a film of low light transmittance or no transparency such as dye-or pigment-containing film, metal foil or the like. In order to satisfy the requirements for adhesivity between various layers, the same treatments as in the dry film resist can be applied.

In the case of the transfer film type resist, the supporting film is peeled off before irradiation. Hence, in order to reduce the tackiness of the resist film surface and thereby prevent dirt pick-up on said surface and the staining or photomask during irradiation, it is possible to form, on the supporting film, a resist film layer consisting of two layers, i.e. a first layer having a glass transition temperature of 20° C. or more and showing no tackiness at normal temperature and a second layer having a glass transition temperature lower than that of the first layer.

In the case, this first layer may be a photosensitive composition of the present invention, or may be a non-photosensitive composition which can be removed with the developer used.

In each of the dry film type resist and the transfer film type resist both mentioned above, the appropriate thickness of the photosensitive resist film is generally about 0.5–15 µm.

In the transfer film type resist employing a two-layered resist film, the appropriate thickness of the first resist layer is generally about 0.1–5 µm.

When the photosensitive compositions of the present invention are used as a dry film type resist, the dry film type resist is press-bonded onto the above-mentioned substrate by the use of a laminator, a press or the like. In the press-bonding, the substrate and/or the pressure roll or pressure plate may be heated to about 250° C. After the press-bonding, a heating treatment is conducted as necessary at a required temperature for a required length of time, for example, at about 60°–150° C. for about 1–30 minutes to give rise to crosslinking and curing. When the press-bonding is conducted under heating, the crosslinking proceeds sufficiently during the press-bonding and the heating treatment after press-bonding may be unnecessary.

The transfer film type resist can be press-bonded onto the substrate in the same manner as in the case of the dry film type resist. In the transfer film type resist after press-bonding or after press-bonding and heating, the supporting film is peeled off from the resist film, prior to irradiation.

The substrate onto which the dry film type resist or the transfer film type resist has been press-bonded as above, is subjected to heating-selective irradiation-heating-development in the same manner as in the case of the photosensitive composition-coated substrate, whereby a pattern can be formed on the substrate. In the case of the dry film type resist, however, the supporting film is peeled off from the resist film, after irradiation.

When the substrate is an etchable type, the exposed portions of the substrate may be removed with an appropriate etchant and, as necessary, the remaining coating film may be removed with an appropriate releasant to obtain a relief image, as in the case of the photosensitive composition-coated substrate.

The thus obtained pattern is very fine, has excellent contrast, and accordingly can be advantageously used in the production of printing plate requiring a fine image; relief; display; printed circuit board; etc.

With the photosensitive compositions of the present invention, the unirradiated portions of the resist film have a crosslinked structure. As a result, the unirradiated portions are highly resistant to the developer or the etchant used and the formed pattern has excellent precision, as compared with the case using conventional positive type photoresists. Therefore, the photosensitive compositions of the present invention are expected to have wide applications in the field of printed circuit board of fine pattern, precise processing of semiconductors (e.g. LSI), fine processing of metals, etc.

The present invention is hereinafter described more specifically by way of Examples. In the Examples, "part(s)" and "%" are by weight.

SYNTHESIS EXAMPLE 1

Synthesis of Polymer A-1 Having Carboxyl Groups and Hydroxyphenyl Groups

Into a flask were placed 600 parts of o-hydroxybenzoic acid, 900 parts of o-cresol, 1,145 parts of 30% formalin, 130 parts of deionized water and 6.5 parts of oxalic acid. The mixture was refluxed by heating, for 60 minutes. Thereto was added 13.5 parts of 15% hydrochloric acid. The resulting mixture was refluxed by heating, for 40 minutes. Thereto was added 400 parts of deionized water of 15° C. The contents in the flask were kept at about 50° C. to precipitate a resin. Thereto was, added 400 parts of deionized water to wash the resin at 50° C. The aqueous layer was removed. The washing operation was repeated three times. The resulting resin was dried at about 120° C. under reduced pressure to obtain a novolac phenol resin (a polymer A-1). Molecular weight=about 650; carboxyl group content=2.8 moles/kg of polymer; hydroxyphenyl group content=5.4 moles/kg of polymer.

SYNTHESIS EXAMPLE 2

Synthesis of Polymer A-2 Having Carboxyl Groups and Hydroxyphenyl Groups

Into a flask were placed 200 parts of tetrahydrofuran, 65 parts of p-hydroxystyrene, 28 parts of n-butyl acrylate, 11 parts of acrylic acid and 3 parts of azobisisobutyronitrile. The gas inside the flask was replaced by nitrogen, after which the flask contents were heated at 100° C. for 2 hours with stirring. The resulting mixture was poured into 1,500 ml of toluene. The resulting precipitate was separated and dissolved in 300 ml of acetone. The solution was poured into 1,500 ml of toluene. The resulting precipitate was separated and dried at 60° C. under reduced pressure to obtain a polymer A-2. Molecular weight=about 5,200; acrylic acid/ n-butyl acrylate/p-hydroxystyrene=17/37/50 (weight ratio); carboxyl group content=1.8 moles/kg of polymer; hydroxyphenyl group content=4.6 moles/kg of polymer.

SYNTHESIS EXAMPLE 3

Synthesis of Polymer A-3 Having Carboxyl Groups and Hydroxyphenyl Groups

Into a flask were placed 200 parts of tetrahydrofuran, 93.5 parts of p-hydroxystyrene, 6.5 parts of acrylic acid and 3 parts of azobisisobutyronitrile. The gas inside the flask was replaced by nitrogen and the flask contents were heated at 100° C. for 2 hours with stirring. The reaction mixture was poured into 1,500 ml of toluene. The resulting precipitate was separated and dissolved in 300 ml of acetone. The solution was poured into 1,500 ml of toluene. The resulting precipitate was separated and dried at 60° C. under reduced pressure to obtain a polymer A-3. Molecular weight=about 2,300; carboxyl group content=1.0 moles/kg of polymer; hydroxyphenyl group content=7.0 moles/kg of polymer.

SYNTHESIS EXAMPLE 4

Synthesis of Polymer A-4 Having Carboxyl Groups

| A mixture consisting of: | |
|---|---|
| acrylic acid | 215 parts |
| styrene | 500 parts |
| n-butyl methacrylate | 284 parts |
| azobisisobutylronitrile (AIBN) | 50 parts | was dropwise added, in 2 hours, to 600 parts of methyl isobutyl ketone being stirred at 80° C. The mixture was kept at that temperature for 2 hours to obtain a polymer A-4. Solid content=about 62.5%; carboxyl group content=3 moles/kg of polymer; aromatic ring content=34.6 parts by weight/100 parts by weight of polymer.

SYNTHESIS EXAMPLE 5

Synthesis of Polymer A-5 Having Carboxyl Groups

| A mixture consisting of: | |
|---|---|
| acrylic acid | 288 parts |
| styrene | 300 parts |
| n-butyl acrylate | 255 parts |
| 2-hydroxyethyl acrylate | 157 parts |
| tert-butyl peroxybenzoate | 100 parts | was dropwise added, in 2 hours, to 1,000 parts of 2-butoxyethanol being stirred at 110° C. The mixture was kept at that temperature for 2 hours to obtain a polymer A-5. Solid contest=about 50%; carboxyl group content=4 moles/kg of polymer; aromatic ring content=20.7 parts by weight/100 parts by weight of polymer.

SYNTHESIS EXAMPLE 6

Synthesis of Polymer A-6 Having Carboxyl Groups

| A mixture consisting of: | |
|---|---|
| acrylic acid | 72 parts |
| styrene | 650 parts |
| ethyl acrylate | 100 parts |
| n-butyl acrylate | 178 parts |
| AIBN | 75 parts | was polymerized in the same manner as in Synthesis Example 4 to obtain a polymer A-6. Solid content=about 62.5%; carboxyl group content=1 moles/kg of polymer; aromatic ring content=45 parts by weight/100 parts by weight of polymer.

SYNTHESIS EXAMPLE 7

Synthesis of Polymer A-7 Having Hydroxyphenyl Groups

Into a flask were placed 1,490 parts of o-cresol, 1,145 parts of 30% formalin, 130 parts of deionized water and 6.5 parts of oxalic acid. The mixture was refluxed by heating, for 60 minutes. Thereto was added 13.5 parts of 15% hydrochloric acid. The mixture was refluxed by heating, for 40 minutes. Thereto was added 400 parts of deionized water of about 15° C. The flask contents were kept at about 75° C. to precipitate a resin. Thereto was added a 35% aqueous sodium hydroxide solution for neutralization. Then, the aqueous layer was removed. To the resin layer was added 400 parts of deionized water to wash the resin at 75° C. The aqueous layer was removed. The washing operation was repeated twice. The resin was dried at about 120° C. under reduced pressure to obtain a novolac phenol resin (a polymer A-7). Molecular weight=about 600.

SYNTHESIS EXAMPLE 8

Synthesis of Polymer A-8 Having Hydroxyphenyl Groups

Into a flask were placed 60 parts of tetrahydrofuran, 21 parts of p-hydroxystyrene, 9 parts of n-butyl acrylate and 3 parts of azobisisobutyronitrile. The gas inside the flask was replaced by nitrogen, and the flask contents were heated at 100° C. for 2 hours with stirring. The reaction mixture was poured into 700 ml of toluene. The resulting precipitate was separated and dissolved in 100 ml of acetone. The solution was poured into 700 ml of toluene. The resulting precipitate was separated and dried at 60° C. under reduced pressure to obtain a polymer A-8. Molecular weight=about 14,000; n-butyl acrylate/p-hydroxystyrene=35/65 (weight ratio).

SYNTHESIS EXAMPLE 9

Synthesis of Vinyl Ether Compound B-1

Into a 250-ml flask were placed 45.6 parts of bisphenol A, 80 ml of 2-chloroethyl vinyl ether and 100 ml of toluene. The gas inside the flask was replaced by nitrogen. 20 g of sodium hydroxide was added. The mixture was heated at 80° C. for 30 minutes. Then, there was added a solution of 4.56 g of tetrabutylammonium bromide in 20 ml of 2-chloroethyl vinyl ether. The mixture was heated at 95° C. for 5 hours for a reaction. The reaction mixture was washed with deionized water three times. The organic layer was separated and subjected to distillation to remove unreacted 2-chloroethyl vinyl ether and toluene to obtain a vinyl ether compound B-1. This compound had two vinyl ether groups in the molecule.

SYNTHESIS EXAMPLE 10

Synthesis of Vinyl Ether Compound B-2

Into a flask were placed 1,490 parts of o-cresol, 1,145 parts of 30% formalin, 130 parts of deionized water and 6.5 parts of oxalic acid. The mixture was refluxed by heating, for 60 minutes. Thereto was added 13.5 parts of 15% hydrochloric acid. The mixture was refluxed by heating, for 40 minutes. Thereto was added 400 parts of deionized water of about 15° C. The flask contents were kept at about 75° C. to precipitate a resin. Thereto was added a 35% aqueous sodium hydroxide solution for neutralization. Then, the aqueous layer was removed. To the resin layer was added 400 parts of deionized water to wash the resin at 75° C. The aqueous layer was removed. The washing operation was repeated twice. The resin was dried at about 120° C. under reduced pressure to obtain a novolac phenol resin. Molecular weight=about 600.

The operation of Synthesis Example 9 was repeated except that 45.6 g of bisphenol A was replaced by 15 g of the above-synthesized resin, to obtain a vinyl ether compound B-2. This compound has about three and one half vinyl ether groups in the molecule.

SYNTHESIS EXAMPLE 11

Synthesis of Vinyl Ether Compound B-3

875 parts of a 75% ethylene glycol dimethyl ether solution of a polyisocyanate obtained by reacting 1 mole of trimethylolpropane with 3 moles of tolylene diisocyanate was reacted with 264 parts of 2-hydroxyethyl vinyl ether in the presence of dibutyltin diacetate at 35° C. for 3 hours to obtain a vinyl ether compound B-3. This compound has three vinyl ether groups in the molecule. Solid content= about 81%.

EXAMPLE 1

A mixture consisting of:

| | |
|---|---|
| polymer A-1 | 100 parts |
| vinyl ether compound B-1 | 60 parts |
| photochemically-acid-generating compound C-1 (see Note 1) | 10 parts | was dissolved in diethylene glycol dimethyl ether to obtain a 20% by weight solution.

The solution was coated on a silicon wafer using a spin coater, to form a film of 1 µm in thickness when dried. The film was dried at 90° C. for 10 minutes.

The thus obtained substrate was irradiated with an ultraviolet light of 356 nm with the exposure being changed gradiently, and then was heated at 120° C. for 20 minutes. The substrate after irradiation and heating was subjected to development with an aqueous solution containing 2.38% of tetramethylammonium hydroxide.

A curve of (a) yield of residual film after development to (b) exposure of ultraviolet light was prepared. From the curve was determined a γ value (see Note 2). The γ value was 11.0, which indicated very high contrast. There was neither decrease nor swelling of the unirradiated film portions.

A film of 1 µm in thickness was formed on a silicon wafer in the same manner and irradiated with an ultraviolet light of 365 nm at an exposure of 8 mJ/cm², through a pattern mask. The irradiated film was subjected to the same treatment as above, to form an image pattern of line/space=1/1 µm. The sectional shape of the image pattern was evaluated by the angle formed by the wafer surface and the wall surface of image pattern. The angle was 98°, which indicated a very excellent pattern shape. The lowest exposure for image formation was 6 mJ/cm².

(Note 1) The following photochemically-acid-generating compound C-1 was used.

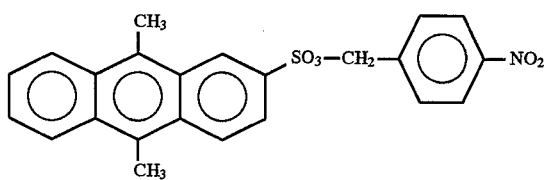

(Note 2) γ value: an index showing a contrast level. A higher γ value shows higher contrast. The measurement of γ value was conducted by the method described in "Photopolymer Handbook" pp. 101–103 (1989), edited by Photopolymer Conference and published by Kogyo Chosakai (Tokyo).

EXAMPLE 2

A mixture consisting of:

| | |
|---|---|
| polymer A-2 | 100 parts |
| vinyl ether compound B-2 | 25 parts |
| photochemically-acid-generating compound C-2 (see Note 3) | 7.5 parts |
| sensitizing colorant 1 (see Note 4) | 1 part | was made into a solution in the same manner as in Example 1. The solution was coated on a silicon wafer using a spin coater, to form a film of 3 µm in thickness when dried. The film was dried at 50° C. for 10 minutes.

The thus obtained substrate was subjected to the same treatment as in Example 1 except that a visible light of 488 nm was used, and the resulting substrate was measured for γ value. The γ value was 10.1, which indicated very high contrast. There was neither decrease nor swelling of the unirradiated film portions.

An image pattern was formed on the substrate obtained as above, in the same manner as in Example 1 except that a visible light of 488 nm was used and the exposure was 3 mJ/cm², and the shape of the pattern was evaluated in the same manner as in Example 1. The angle was 87°, which indicated a very excellent pattern shape. The lower exposure for image formation was 2 mJ/cm².

(Note 3) The following photochemically-acid-generating compound C-2 was used.

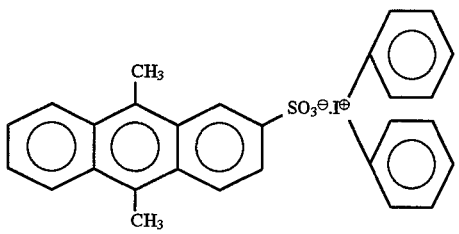

(Note 4) The following sensitizing colorant 1 was used.

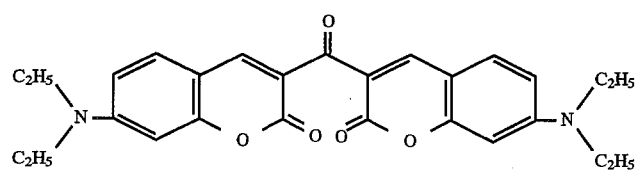

EXAMPLE 3

| A mixture consisting of: | |
| --- | --- |
| Polymer A-3 | 100 parts |
| vinyl ether compound B-3 (solid content = 81%) | 20 parts |
| photochemically-acid-generating compound C-3 (see Note 5) | 5 parts | was made into a solution in the same manner as in Example 1. The solution was coated on a substrate (a copper foil-laminated polyimide film, copper foil thickness=18 µm) using a roll coater, to form a film of 5 µm in thickness when dried. The film was dried at 110° C. for 10 minutes.

The thus obtained substrate was subjected to the same treatment as in Example 1 and measured for γ value. The γ value was 9.9 and was very high.

A substrate having a film thereon was formed in the same manner as above. The substrate was irradiated with a light of 365 nm emitted from an ultrahigh-pressure mercury lamp, at an exposure of 12 mJ/cm² through a photomask of line/space=50/50 µm. The resulting substrate was heated at 130° C. for 15 minutes. The substrate after heating was subjected to development with a 3% aqueous sodium carbonate solution; then, the exposed copper was etched with copper chloride; thereafter, the remaining film on the substrate was removed with a 3% aqueous sodium hydroxide solution; thereby, an excellent etching pattern was formed on the substrate.

(Note 5) The following photochemically-acid-generating compound C-3 was used.

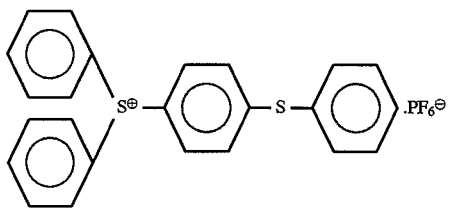

EXAMPLE 4

| A mixture consisting of: | |
| --- | --- |
| polymer A-4 (solid content = 62.5%) | 80 parts |
| polymer A-7 | 65 parts |
| vinyl ether compound B-1 | 60 parts |
| photochemically-acid-generating compound C-1 | 10 parts | was dissolved in diethylene glycol dimethyl ether to obtain a 20% by weight solution.

The solution was coated on a silicon wafer using a spin coater to form a film of 1 µm in thickness when dried. The film was dried at 90° C. for 10 minutes.

The thus obtained substrate was irradiated with an ultraviolet light of 356 nm with the exposure being changed gradiently, and then was heated at 120° C. for 20 minutes. The substrate after irradiation and heating was subjected to development with an aqueous solution containing 2.38% of tetramethylammonium hydroxide.

A curve of (a) yield of residual film after development to (b) exposure of ultraviolet light was prepared. From the curve was determined a γ value. The γ value was 10.2, which indicated very high contrast. There was neither decrease nor swelling of the unirradiated film portions.

A film of 1 µm in thickness was formed on a silicon wafer in the same manner and irradiated with an ultraviolet light of 365 nm at an exposure of 8 mJ/cm², through a pattern mask. The irradiated film was subjected to the same treatment as above, to form an image pattern of line/space=1/1 µm. The section shape of the image pattern was evaluated by the angle formed by the wafer surface and the wall surface of image pattern. The angle was 89°, which indicated a very excellent pattern shape. The lowest exposure for image formation was 6 mJ/cm².

EXAMPLE 5

| A mixture consisting of: | |
| --- | --- |
| polymer A-5 (solid content = 50%) | 200 parts |
| polymer A-8 | 100 parts |
| vinyl ether compound B-2 | 100 parts |
| photochemically-acid-generating compound C-2 | 7.5 parts |
| sensitizing colorant 1 | 1 part | was made into a solution in the same manner as in Example 4. The solution was coated on a silicon wafer using a spin coater, to form a film of 3 µm in thickness when dried. The film was dried at 50° C. for 10 minutes.

The thus obtained substrate was irradiated to the same treatment as in Example 4 except that visible light of 488 nm was used, and the resulting substrate was measured for γ values. The γ value was 11.3, which indicated very high contrast. There was neither decrease nor swelling of the unirradiated film portions.

A dried film was formed on a silicon wafer in the same manner as above. Using this substrate, an image pattern was formed in the same manner as in Example 4 except that irradiation was made using a visible light of 488 nm at an exposure of 2 mJ/cm² and the heating after irradiation was conducted to 90° C. for 10 minutes. The shape of the image pattern was evaluated in the same manner as in Example 4. The angle was 88°, which indicated a very excellent pattern shape. The lowest exposure for image formation was 1.5 mJ/cm².

EXAMPLE 6

| A mixture consisting of: | |
| --- | --- |
| polymer A-6 (solid content = 62.5%) | 112 parts |
| polymer A-8 | 30 parts |
| vinyl ether compound B-3 (solid content = 81%) | 15 parts |
| photochemically-acid-generating compound C-3 | 5 parts | was made into a solution in the same manner as in Example 4. The solution was coated on a substrate (a copper foil-laminated polyimide film, copper foil thickness=18 µm) using a roll coater, to form a film of 5 µm in thickness when dried. The film was dried at 100° C. for 15 minutes.

The thus obtained substrate was subjected to the same treatment as in Example 4 and measured for γ value. The γ value was 9.8 and was very high.

A substrate having a film thereon was formed in the same manner as above. The substrate was irradiated, with a light of 365 nm emitted from an ultrahigh-pressure mercury lamp, at an exposure of 10 mJ/cm² through a photomask of line/space=50/50 µm. The resulting substrate was heated at 100° C. for 15 minutes. The substrate after heating was subjected to development with a 3% aqueous sodium carbonate solution; then, the exposed copper was etched with copper chloride; thereafter, the remaining film on the substrate was removed with a 3% aqueous sodium hydroxide solution; thereby, an excellent etching pattern was formed on the substrate.

COMPARATIVE EXAMPLE 1

Carboxyl group-containing polymer 1

| A mixture consisting of: | |
|---|---|
| acrylic acid | 288 parts |
| styrene | 300 parts |
| n-butyl acrylate | 300 parts |
| 2-hydroxyethyl acrylate | 112 parts |
| tert-butyl peroxybenzoate | 100 parts | was dropwise added, in 2 hours, to 1,000 parts of 2-butoxyethanol being stirred at 110° C. The mixture was kept at that temperature for 2 hours to obtain a polymer 1. Solid content=about 50% carboxyl group content=4 moles/kg of polymer; aromatic ring content=20.7 parts by weight/100 parts by weight of polymer.

The following materials:

polymer 1 (solid content=50%) 200 parts photosensitizer 1 (see Note 6) 30 parts were dissolved in diethylene glycol dimethyl ether to obtain a 20% solution. The solution was coated on a silicon wafer using a spin coater, to form a film of 1.3 μm in thickness when dried. The film was dried at 120° C. for 20 minutes. The thus obtained substrate was subjected to the same treatment as in Example 1 to prepare a characteristic curve. The γ value was 2.1, and the unirradiated film portions were dissolved by about 30% when the irradiated film portions were completely dissolved.

The developer was changed to a 0.5% aqueous sodium carbonate solution and a γ value was measured in the same manner. The γ value was 3.3, and the unirradiated film portions were dissolved by about 3% when the irradiated film portions were completely dissolved.

A pattern was formed on the above obtained substrate in the same manner as in Example 1 except that the exposure was changed to 80 mJ/cm² and the developer was changed to a 0.5% aqueous sodium carbonate solution. The sectional shape of the pattern was observed. The angle between the substrate and the pattern was 79°. In this Example, no image pattern could be formed when the exposure was 60 mJ/cm² or less.

(Note 6) The following photosensitizer 1 was used.

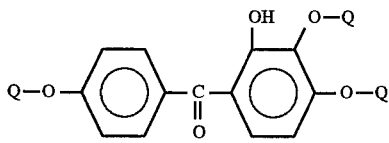

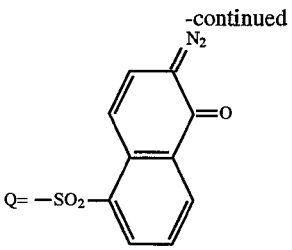

$Q = -SO_2-$

COMPARATIVE EXAMPLE 2

Polymer 2

In a flask were placed 1,490 parts of o-cresol, 1,145 part of 30% formalin, 130 parts of deionized water and 6.5 parts of oxalic acid. The mixture was refluxed by heating, for 60 minutes. Thereto was added 13.5 parts of 15% hydrochloric acid. The mixture was refluxed by heating, for 40 minutes. Thereto was added 400 parts of deionized water of about 15° C. The flask contents were kept at about 75° C. to precipitate a resin. Thereto was added a 35% aqueous sodium hydroxide solution to conduct neutralization. The aqueous layer was removed. To the resin layer was added 400 parts of deionized water, and the resin was washed at 75° C. Then, the aqueous layer was removed. The washing operation was repeated twice. The resulting resin was dried at about 120° C. under reduced pressure to obtain a novolac phenol resin (a polymer 2) having a molecular weight of about 600.

| The following materials: | |
|---|---|
| polymer 2 | 100 parts |
| photosensitizer 1 | 20 parts | were made into a solution in the same manner as in Comparative Example 1. The solution was coated on a silicon wafer to form a film of 1.3 μm, in the same manner as in Comparative Example 1. The film was dried in the same manner as in Comparative Example 1 to obtain a substrate. The substrate was measured for γ value in the same manner as in Example 1.

The γ value was 4.6. The unirradiated film portions were dissolved by about 15% when the irradiated film portions were completely dissolved.

A pattern was formed on the above obtained substrate in the same manner as in Example 1 except that the exposure was changed to 80 mJ/cm². The sectional shape of the pattern was observed. The angle between the substrate and the pattern was 82°. In this Example, no image pattern could be formed when the exposure was 55 mJ/cm² or less.

EXAMPLE 7

| The following materials: | |
|---|---|
| polymer A-2 | 100 parts |
| vinyl ether compound B-1 | 30 parts |
| photochemically-acid-generating compound C-1 | 8 parts | were dissolved in ethylene glycol monoethyl ether to obtain a 30% by weight solution. The solution was coated, using a roll coater, on a polyethylene terephthalate film of 75 μm in thickness subjected to a treatment for easy peeling and having thereon an aminoalkd resin film of 3 μm in thickness, whereby a coating film of 5 μm in thickness when dried was formed on the terephthalate film. The coating film was dried at 50° C. for 10 minutes. On the dried coating film was mounted a polyethylene terephthalate film of 100 µm in thickness subjected to a silicon treatment for release, whereby a dry film type resist was obtained.

The dry film type resist was press-bonded, using a laminator having a roll temperature of 100° C., onto a substrate which was a polyimide film of 100 µm in thickness having laminated thereon a copper foil of 18 µm in thickness.

The resulting substrate was irradiated in the same manner as in Example 1 and then the supporting film was peeled off. The resulting substrate was heated at 110° C. for 10 minutes and then measured for γ value in the same manner as in Example 1. The γ value was very high (8.5). There was neither decrease nor swelling of the unirradiated film portions.

On the substrate prepared as above was formed an etching pattern in the same manner as in Example 3 except that the supporting film was peeled off after irradiation. The etching pattern had no defect and was of high quality.

EXAMPLE 8

Measurement of γ value and formation of etching pattern were conducted in the same manner as in Example 7 except that the supporting film was peeled off after the resist film had been press-bonded onto the substrate, whereby a transfer resist film was formed on the substrate. The γ value was very high (8.7). There was neither decrease nor swelling of the unirradiated film portions. The etching pattern had no defect and was of high quality.

EXAMPLE 9

On a polyethylene terephthalate film of 75 µm in thickness was formed, as a first layer, a polyvinyl alcohol coating film of 2 µm in thickness. Thereon was coated, using a roll coater, a methoxypropanol solution containing 25% by weight of the following materials:

| | |
|---|---|
| polymer A-5 (solid content = 50%) | 200 parts |
| polymer A-8 | 100 parts |
| vinyl ether compound B-2 | 100 parts |
| photochemically-acid-generating compound C-2 | 7.5 parts |
| sensitizing colorant 1 | 1 part | so as to give a coating film of 8 µm in thickness when dried. The resulting material was dried at 60° C. for 5 minutes to obtain a transfer film type resist.

The transfer film type resist was press-bonded onto the same substrate as in Example 6, using a laminator having a roll temperature of 75° C. Then, the supporting film was peeled off. A γ value was measured in the same manner as in Example 5. The γ value was very high (11.1). There was neither decrease nor swelling of the unirradiated film portions.

The same resist was press-bonded on the same substrate in the same manner as above, to form a transfer resist film on the substrate. On this film was drawn a pattern of line/space=30 µm/30 µm, at an energy density of 2 mJ/cm² using a direct-drawing machine employing an argon ion laser beam of 488 nm. The resulting film was heated at 100° C. for 15 minutes and then subjected to development with a 3% aqueous sodium carbonate solution. The exposed copper portions were etched using cupric chloride. The remaining resist film on the substrate was removed with a 3% aqueous sodium hydroxide solution, whereby an etching pattern having no defect and of high quality was formed on the substrate.

What we claimed is:

1. A process for pattern formation, which comprises conducting sequentially a step of coating a photosensitive composition comprising
   (A) a polymer having 0.5 to 10 equivalents of carboxyl groups per kg of said polymer and at least one equivalent of hydroxyphenyl group per kg of said polymer, said polymer having a number-average molecular weight of about 500 to about 100,000 and a glass transition temperature not lower than 0° C.;
   (B) a low-molecular weight or high-molecular weight compound having two to four vinyl ether groups each represented by the formula —R'—O—CH=CH$_2$ wherein R' represents a straight-chain or branched-chain alkylene group of 1–6 carbon atoms, said compound being present in the composition in an amount of 5–150 parts by weight per 100 parts by weight of said polymer (A); and
   (C) a compound which generates an acid when irradiated with an actinic ray and is selected from the group consisting of compounds of the following formulae (I) to (XIV):

wherein Ar represents an aryl group; and $X^{\ominus}$ represents $PF_6^{\ominus}$, $SbF_6^{\ominus}$ or $AsF_6^{\ominus}$,

wherein Ar and $X^{\ominus}$ have the same definitions as in formula (I),

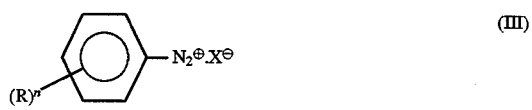

wherein R represents an alkyl group of 1–12 carbon atoms or an alkoxy group of 1–12 carbon atoms; n is an integer from 0 to 3; and $X^{\ominus}$ has the same definition as in formula (I),

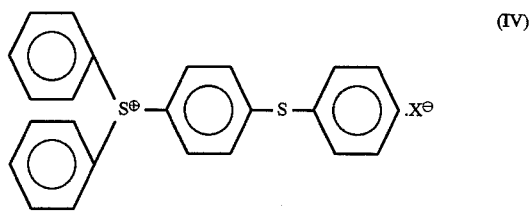

wherein $X^{\ominus}$ has the same definition as in formula (I),

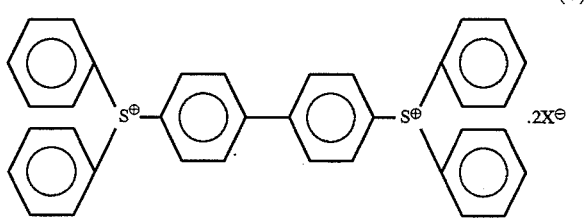

wherein $X^{\ominus}$ has the same definition as in formula (I),

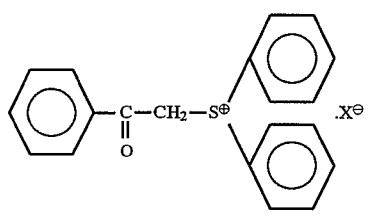
(VI)

wherein $X^{\ominus}$ has the same definition as in formula (I),

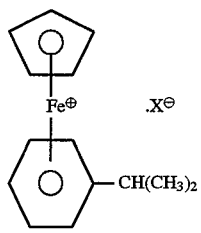
(VII)

wherein $X^{\ominus}$ has the same definition as in formula (I),

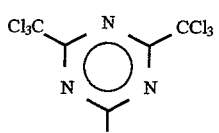
(VIII)

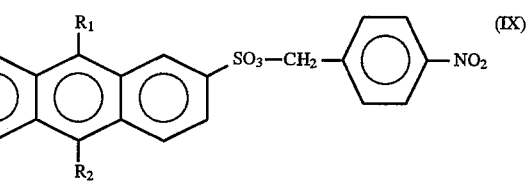
(IX)

wherein $R_1$ and $R_2$ independently represent an alkyl group of 1–12 carbon atoms or an alkoxy group of 1–12 carbon atoms,

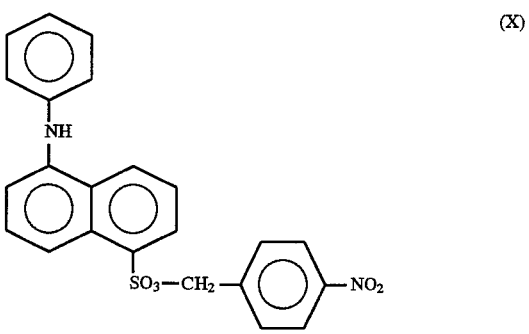
(X)

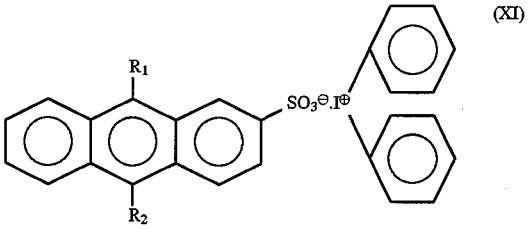
(XI)

wherein $R_1$ and $R_2$ have the same definitions as in formula (IX),

(XII)

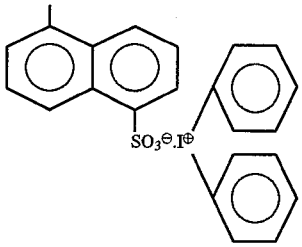

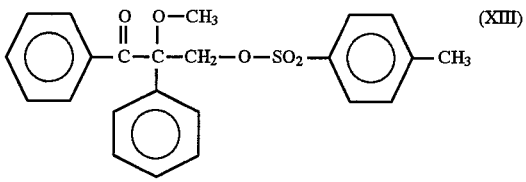
(XIII)

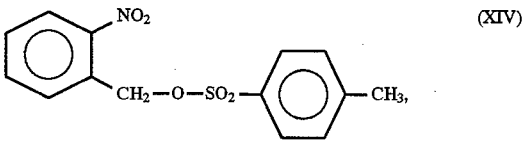
(XIV)

said compound (C) being present in the composition in an amount of 0.1 to 40 parts by weight per 100 parts by weight of the total of said polymer (A) and said compound (B) in the composition, on a substrate, a step of heating the coated substrate, a step of irradiating the resulting substrate selectively with an actinic ray, a step of heating the irradiated substrate, and a step of subjecting the resulting substrate to development with a basic developer.

2. A process for pattern formation, which comprises conducting sequentially a step of coating a photosensitive composition comprising (A) a polymer having 0.5 to 10 equivalents of carboxyl groups per kg of said polymer and at least one equivalent of hydroxyphenyl group per kg of said polymer, said polymer having a number-average molecular weight of about 500 to about 100,000 and a glass transition temperature not lower than 0° C.;

(B) a low-molecular weight or high-molecular weight compound having two to four vinyl ether groups each represented by the formula —R'—O—CH=CH$_2$ wherein R' represents a straight-chain or branched-chain alkylene group of 1–6 carbon atoms, said compound being present in the composition in an amount of 5–150 parts by weight per 100 parts by weight of said polymer (A); and (C) a compound which generates an acid when irradiated with an actinic ray and is selected from the group consisting of compounds of the following formulae (I) to (XIV):

$$Ar_2I^{\oplus}.X^{\ominus} \qquad (I)$$

wherein Ar represents an aryl group; and $X^{\ominus}$ represents $PF_6^{\ominus}$, $SbF_6^{\ominus}$ or $AsF_6^{\ominus}$,

 (II)

wherein Ar and X⁻ have the same definitions as in formula (I),

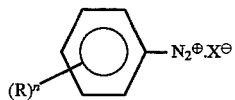 (III)

wherein R represents an alkyl group of 1–12 carbon atoms or an alkoxy group of 1–12 carbon atoms; n is an integer from 0 to 3; and X⁻ has the same definition as in formula (I),

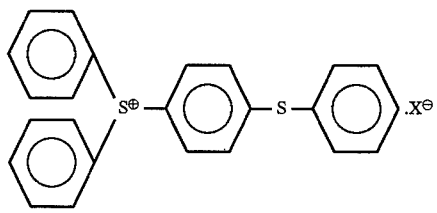 (IV)

wherein X⁻ has the same definition as in formula (I),

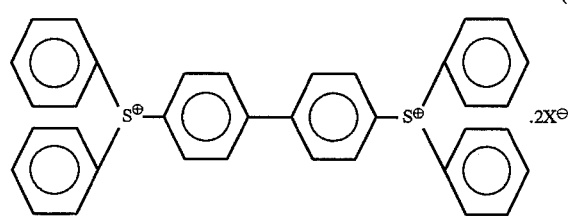 (V)

wherein X⁻ has the same definition as in formula (I),

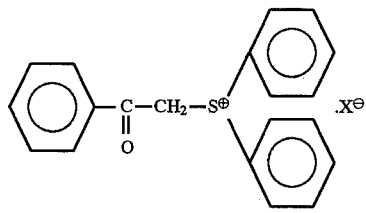 (VI)

wherein X⁻ has the same definition as in formula (I),

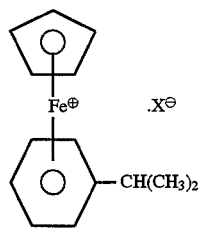 (VII)

wherein X⁻ has the same definition as in formula (I),

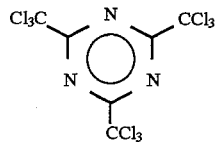 (VIII)

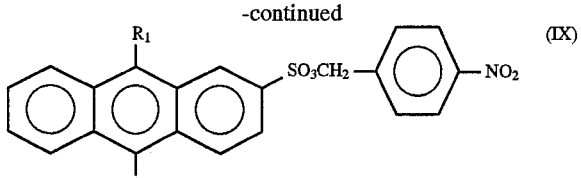 (IX)

wherein $R_1$ and $R_2$ independently represent an alkyl group of 1–12 carbon atoms or an alkoxy group of 1–12 carbon atoms,

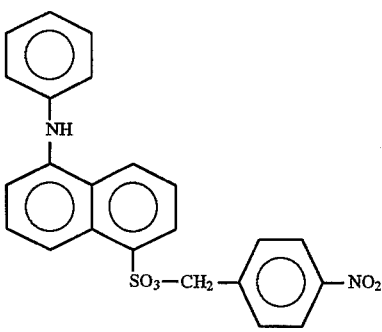 (X)

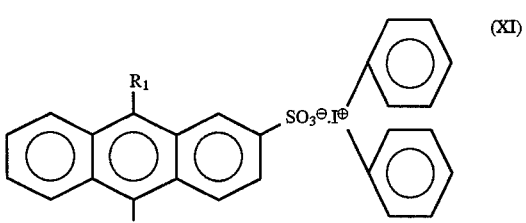 (XI)

wherein $R_1$ and $R_2$ have the same definitions as in formula (IX),

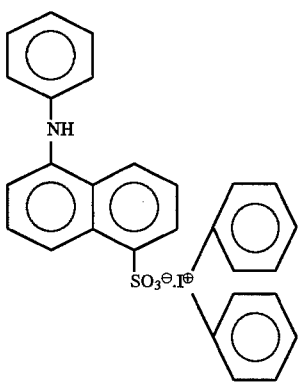 (XII)

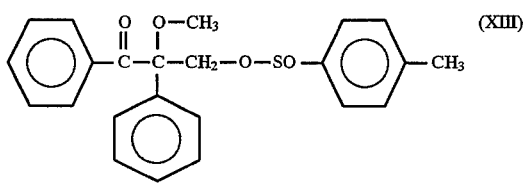 (XIII)

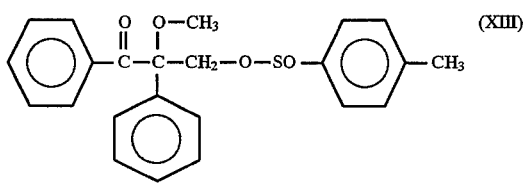 (XIV)

said compound (C) being present in the composition in an amount of 0.1 to 40 parts by weight per 100 parts by weight of the total of said polymer (A) and said compound (B) in the composition, on a transparent supporting film capable of transmitting an actinic ray, followed by drying to form a photosensitive coating layer on the supporting film to obtain a dry film resist, a step of press-bonding the photosensitive coating layer of the dry film resist onto a substrate, a step of heating the dry film resist-bonded substrate, a step or irradiating the resulting substrate at the supporting film side selectively with an actinic ray, a step of heating the irradiated substrate, and a step of peeling off the supporting film and then subjecting the resulting substrate to development with a basic developer.

3. A process for pattern formation, which comprises conducting sequentially a step of coating a photosensitive composition comprising
      (A) a polymer having 0.5 to 10 equivalents of carboxyl groups per kg of said polymer and at least one equivalent of hydroxyphenyl group per kg of said polymer, said polymer having a number-average molecular weight of about 500 to about 100,000 and a glass transition temperature not lower than 0° C.;
      (B) a low-molecular weight or high-molecular weight compound having two to four vinyl ether groups each represented by the formula —R'—O—CH=CH$_2$ wherein R' represents a straight-chain or branched-chain alkylene group of 1–6 carbon atoms, said compound being present in the composition in an amount of 5–150 parts by weight per 100 parts by weight of said polymer (A); and
      (C) a compound which generates an acid when irradiated with an actinic ray and is selected from the group consisting of compounds of the following formulae (I) to (XIV):

$Ar_2I^{\oplus}.X^{\ominus}$ (I)

wherein Ar represents an aryl group; and $X^{\ominus}$ represents $PF_6^{\ominus}$, $SbF_6^{\ominus}$ or $AsF_6^{\ominus}$, $Ar_3S^{\oplus}.X^{\ominus}$ (II)

wherein Ar and $X^{\ominus}$ have the same definitions as in formula (I),

(III)

wherein R represents an alkyl group of 1–12 carbon atoms or an alkoxy group of 1–12 carbon atoms; n is an integer from 0 to 3; and $X^{\ominus}$ has the same definition as in formula (I),

(IV)

wherein $X^{\ominus}$ has the same definition as in formula (I),

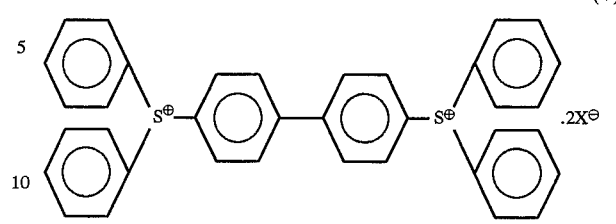
(V)

wherein $X^{\ominus}$ the same definition as in formula (I),

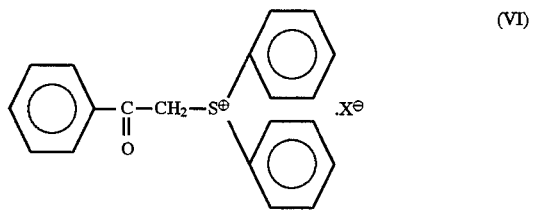
(VI)

wherein $X^{\ominus}$ the same definition as in formula (I),

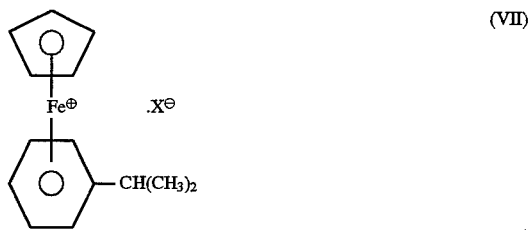
(VII)

wherein $X^{\ominus}$ the same definition as in formula (I),

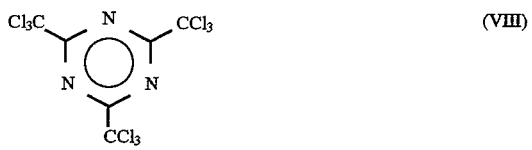
(VIII)

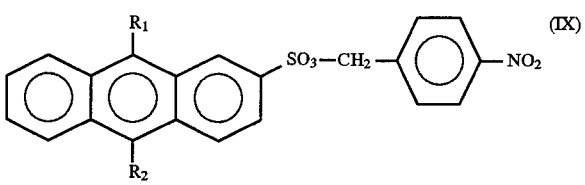
(IX)

wherein $R_1$ and $R_2$ independently represent an alkyl group of 1–12 carbon atoms or an alkoxy group of 1–12 carbon atoms,

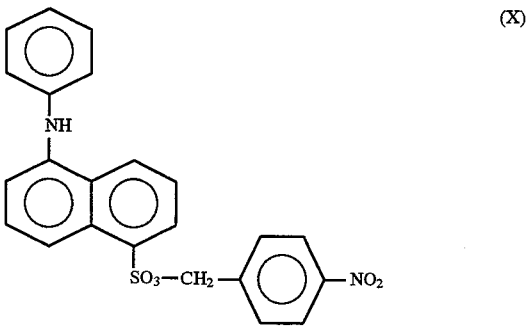
(X)

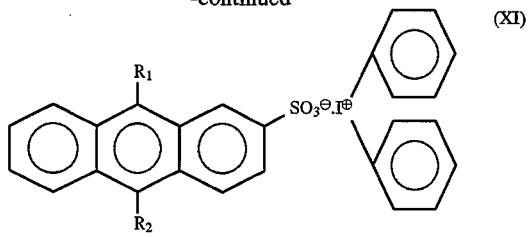
(XI)

wherein $R_1$ and $R_2$ have the same definitions as in formula (IX),

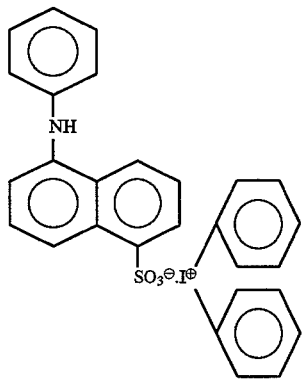
(XII)

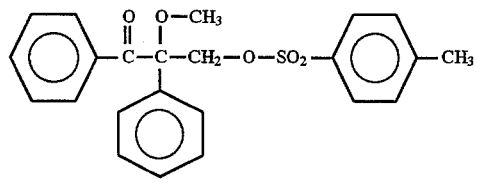
(XIII)

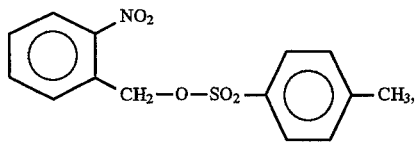
(XIV)

said compound (C) being present in the composition in an amount of 0.1 to 40 parts by weight per 100 parts by weight of the total of said polymer (A) and said compound (B) in the composition, on a transfer film, followed by drying to form a photo-sensitive coating layer on the transfer film to obtain a transfer film resist, a step of press-bonding the photosensitive coating layer of the transfer film resist onto a substrate, a step of heating the transfer film resist-bonded substrate, a step of peeling off the transfer film and irradiating the resulting substrate selectively with an actinic ray, a step of heating the irradiated substrate, and a step of subjecting the resulting substrate to development with a basic developer.

* * * * *